United States Patent [19]

Kobayashi et al.

[11] Patent Number: 4,732,313
[45] Date of Patent: Mar. 22, 1988

[54] APPARATUS AND METHOD FOR MANUFACTURING SEMICONDUCTOR DEVICE

[75] Inventors: Mituo Kobayashi, Aioi; Osamu Usuda, Tatsuno; Yoshihiko Sano, Hyogo; Koichiro Atsumi, Yokohama, all of Japan

[73] Assignee: Kabushiki Kaisha Toshiba, Kawasaki, Japan

[21] Appl. No.: 759,273

[22] Filed: Jul. 26, 1985

[30] Foreign Application Priority Data

Jul. 27, 1984 [JP] Japan .................. 59-155591
Oct. 19, 1984 [JP] Japan .................. 59-219902
Oct. 19, 1984 [JP] Japan .................. 59-219903

[51] Int. Cl.⁴ .......................................... H01L 21/60
[52] U.S. Cl. ........................... 228/179; 228/4.5; 228/220; 219/56.22
[58] Field of Search ............. 228/4.5, 179, 219, 220; 219/56.22

[56] References Cited

U.S. PATENT DOCUMENTS

| | | | |
|---|---|---|---|
| 3,051,026 | 8/1962 | Costa | 228/4.5 |
| 3,102,331 | 9/1963 | Da Costa | 228/4.5 |
| 3,617,682 | 11/1971 | Hall | 228/4.5 |
| 4,142,288 | 3/1979 | Flammer et al. | 228/4.5 X |
| 4,166,562 | 9/1979 | Keizer et al. | |
| 4,340,166 | 7/1966 | Bilane et al. | 228/179 |
| 4,476,365 | 10/1984 | Kurtz et al. | 219/56.22 |
| 4,564,734 | 1/1986 | Okikawa | 219/56.22 |

FOREIGN PATENT DOCUMENTS

| | | |
|---|---|---|
| 3270 | 8/1979 | European Pat. Off. |
| 2618867 | 11/1977 | Fed. Rep. of Germany |
| 57-13747 | 1/1982 | Japan |
| 57-53954 | 3/1982 | Japan |
| 58-169918 | 10/1983 | Japan |
| 2117299 | 10/1983 | United Kingdom |

*Primary Examiner*—Kenneth J. Ramsey
*Attorney, Agent, or Firm*—Finnegan, Henderson, Farabow, Garrett & Dunner

[57] ABSTRACT

A lead frame is conveyed along a convey direction in a convey path filled with a reducing gas. A semiconductor pellet is placed on the lead frame at a die bonding portion. A bonding wire made of copper or a copper alloy is supplied to the next wire bonding portion. The lower end of the bonding wire is melted with an oxyhydrogen torch surrounded by an air curtain, thereby forming a ball. The bonding wire is guided into the convey path by a capillary. The ball is thermocompressed to an electrode pad of the semiconductor pellet. The other end of the bonding wire is fused and thermocompressed against the outer lead of the lead frame at a postbonding portion. The bonding wire is thus looped between the semiconductor pellet and the outer lead.

19 Claims, 5 Drawing Figures

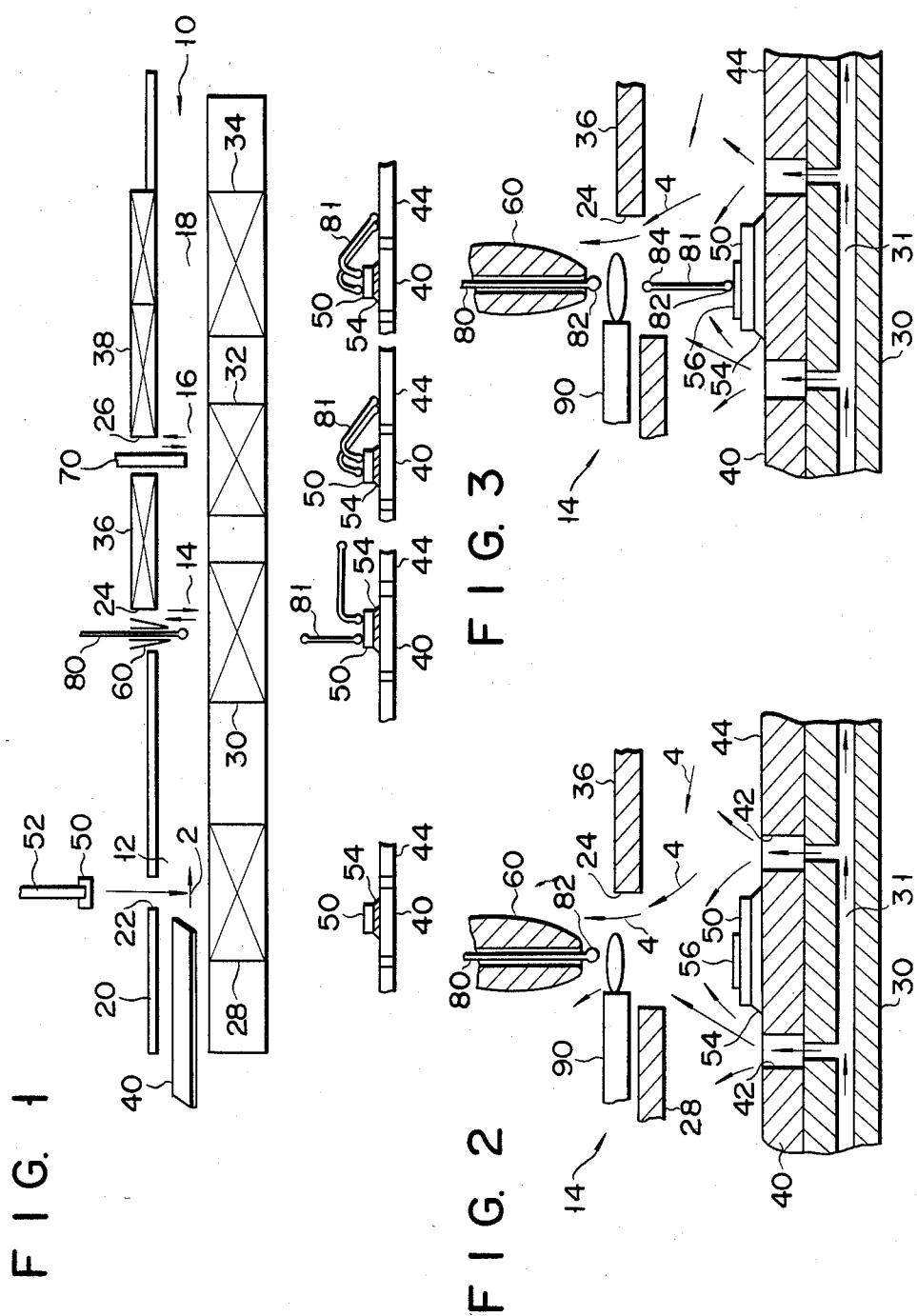

APPARATUS AND METHOD FOR MANUFACTURING SEMICONDUCTOR DEVICE

BACKGROUND OF THE INVENTION

The present invention relates to an apparatus for manufacturing a semiconductor device.

In conventional semiconductor fabrication techniques, an electrode pad of a semiconductor element (pellet) is connected to an outer lead by looping a gold bonding wire. When a gold wire is used, however, the following problems occur.

(1) When a bonding wire is looped at a high temperature, an intermetallic compound of gold and aluminum is formed at a bonding region between the Al electrode pad and the bonding wire. For this reason, electrical characteristics at the bonding region are degraded.

(2) Even if the gold bonding wire itself is not oxidized, the reliability of the semiconductor device is impaired due to degradation in electrical characteristics at the bonding region.

(3) Since an intermetallic compound of gold and aluminum is formed after the bonding process, a semiconductor device with stable electrical characteristics cannot be manufactured.

(4) Gold wire is expensive and increases the manufacturing cost of the semiconductor device.

In order to resolve the above problems, prospective bonding regions are selectively activated to loop a copper bonding wire between an electrode pad and a copper lead frame, as disclosed in Japanese patent application No. 55-88318. According to this technique, however, a bonding failure occurs due to an oxide formed on the bonding wire. At the same time, it is difficult to form a ball of a predetermined size at a distal end of the bonding wire, thereby resulting in incomplete bonding. In addition, the prospective bonding region must be activated every time bonding is performed, thereby lowering operation efficiency.

In Japanese patent application No. 57-51237, a distal end of a capillary through which a bonding wire extends is introduced into a reducing atmosphere in a cover to form a desired ball. At the same time, oxidation of the bonding wire is prevented, thereby performing bonding. According to this conventional technique, a complicated mechanism including a cover for holding the reducing atmosphere is required. A failure often occurs when a bonding speed is 1 second or less, so that maintenance is cumbersome. In addition, since an oxide on the lead frame having outer leads cannot be eliminated, bonding between the copper bonding wire and the copper lead frame cannot be performed with high reliability.

SUMMARY OF THE INVENTION

It is an object of the present invention to provide an apparatus for manufacturing a semiconductor device, wherein wire bonding can be performed with high reliability at low cost and provide a bonding region with high strength.

In order to achieve the above object of the present invention, there is provided an apparatus for manufacturing a semiconductor device, wherein a bonding wire is looped between an electrode pad of a semiconductor element and an outer lead of a lead frame, comprising:

a convey path for conveying the lead frame along a convey direction, the convey path being provided with a wire bonding portion and postbonding portion which are separated from each other along the convey direction;

ball forming means for heating the bonding wire of copper or a copper alloy at the wire bonding portion and forming balls at both ends of the bonding wire;

bonding wire feeding means for feeding the bonding wire to the wire bonding portion and compressing the ball of the bonding wire on the electrode pad;

compressing means for compressing the ball of the bonding wire on the outer lead at the postbonding portion; and gas supply means for supplying a reducing or inert gas to the wire bonding portion and the postbonding portion and surrounding the bonding wire and the ball with the reducing or inert gas.

According to the present invention, the bonding wire of copper or a copper alloy can be bonded by a simple apparatus to the electrode pad of the semiconductor device and the outer lead of the lead frame without causing incomplete bonding. A semiconductor device having high durability in a thermal cycle or a high-temperature exposure test can be manufactured. Since copper or a copper alloy can be used as a material for the bonding wire and the lead frame, the material cost can be low, thereby enabling production of low-cost semiconductor devices with a high yield. Furthermore, a plastic encapsulated high-power semiconductor device with high reliability can be easily manufactured.

BRIEF DESCRIPTION OF THE DRAWINGS

FIG. 1 shows an overall configuration of an apparatus for manufacturing a semiconductor device according to an embodiment of the present invention;

FIGS. 2 to 6 are longitudinal sectional views, respectively, showing the steps of manufacturing a semiconductor device;

DETAILED DESCRIPTION OF THE PREFERRED EMBODIMENTS

Figure 4:
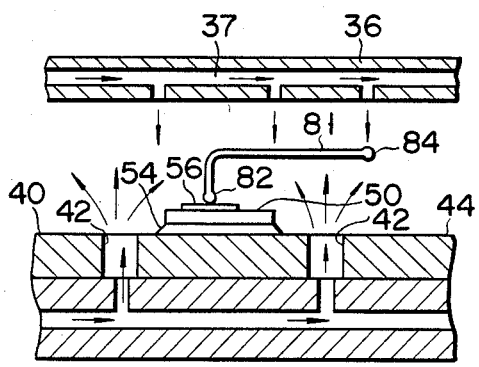

FIG. 1 shows an overall configuration of an apparatus for manufacturing a semiconductor device according to an embodiment of the present invention. FIGS. 2 to 6 are partially enlarged sectional views, respectively, of the same. A convey path 10 for a lead frame 40 is constituted by a substantially cylindrical cover 20. Only an upper plate of the cover 20 is shown in FIG. 1. A die bonding portion 12, a wire bonding portion 14, a postbonding portion 16 and a postbaking portion 18 are arranged in the convey path 10 along a convey direction (indicated by arrow 2) of the lead frame 40 in the order named. Windows 22, 24 and 26 are formed in the upper plate of the cover 20 so as to correspond to the portions 12, 14 and 16, respectively. Heater blocks 28, 30, 32 and 34 for heating the lead frame 40 are provided to the convey path 10 to correspond to the portions 12, 14, 16 and 18, respectively. A gas path (see a gas path 31 in FIG. 2) for introducing a reducing gas to the path 10 is formed in each of the heater blocks 28, 30, 32 and 34. The reducing gas can be obtained by, e.g., mixing 10% by volume of $H_2$ gas with $N_2$ gas. The reducing gas is supplied to the convey path 10 through the gas path.

A gas introducing member 36 is arranged on the upper plate of the cover 20 of the convey path 10 between the portions 14 and 16. Another gas introducing member 38 is arranged on the upper plate of the cover 20 of the convey path 10 to correspond to the portion 18. As shown in detail in FIGS. 4, 5 and 6, gas paths 37 and 39 are formed in the members 36 and 38, respectively. The reducing gas obtained by mixing $H_2$ gas with $N_2$ gas is supplied to the convey path 10 through the gas paths 37 and 39 of the members 36 and 38, respectively. In this manner, the interior of the convey path 10 is filled with a reducing gas, e.g., $N_2 + 10\%$ $H_2$.

A collet 52 capable of clamping a semiconductor pellet (semiconductor element) 50 is provided at a position corresponding to the portion 12 so as to be capable of approaching and withdrawing from the convey path 10. The collet 52 can be inserted in the convey path 10 through the window 22 in the portion 12. The pellet 50 is supplied to the convey path 10 through the collet 52. A capillary 60 can clamp a bonding wire 80 and is arranged in the vicinity of the portion 14 so as to be capable of approaching and withdrawing from the convey path 10. The capillary 60 can be inserted in the convey path 10 through the window 24 in the portion 14. The bonding wire 80 is supplied to the convey path by the capillary 60. The bonding wire 80 is made of copper such as oxygen free copper and phosphor deoxidized copper, or a copper alloy such as Cu-20% Au. A compressing member 70 for thermocompressing the bonding wire 80 to an outer lead of the lead frame 40 is arranged at a position to correspond to the portion 16. The compressing member 70 can be inserted in and escape from the convey path 10 through the window 26 in the portion 16.

A guide rail (not shown) extends along a direction indicated by arrow 2 on the bottom of the convey path 10. The lead frame 40 is conveyed along the direction indicated by arrow 2 on the guide rail. The lead frame 40 is made of copper such as oxygen free copper and phosphor deoxidized copper, or a copper alloy. A mount portion 46 for the semiconductor pellet and an outer lead 44 are formed on the lead frame 40, as shown in detail in FIG. 7. Meanwhile, the gas path 31 is formed in the heater block 30 to receive the reducing gas from a supply source. The reducing gas is discharged to the convey path 10 through a gap 42 between the mount portion 46 for the semiconductor pellet and the outer lead 44 formed on the lead frame 40. The remaining heater blocks 28, 32 and 34 have similar structures to that of the heater block 30. In the heater blocks 28, 32 and 34, the reducing gas is introduced to the convey path 10 from the gas path 31 directly or through the gap 42.

Figure 8:
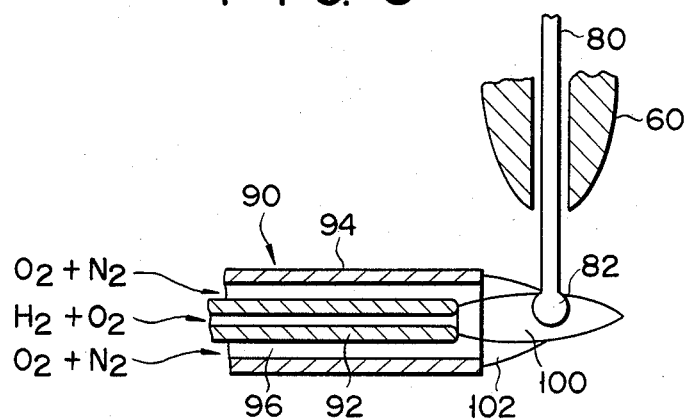
FIG. 8 is a sectional view showing a structure of a burner.

As shown in detail in FIG. 2, a burner 90 is arranged outside the cover 20 and in the vicinity of the window 24 through which the capillary 60 provided at the portion 14 is inserted. As shown in detail in FIG. 8, the burner 90 comprises an inner tube 92 and an outer tube 94 coaxially surrounding it. The outer tube 94 has a distal end slightly projecting from the inner tube 92. A gas mixture of $H_2$ and $O_2$ is sprayed from the tube 92 to form an oxyhydrogen torch 100. A lower end of the bonding wire 80 is heated by the torch 100 to, e.g., 1,000° C. or higher and melted, thereby forming a ball 82. A gas mixture of $O_2$ and $N_2$ gases is discharged from a space 96 between the tubes 94 and 92 to form an air curtain 102 around the torch 100. As shown in FIG. 2, a peripheral portion of the cover 20 defining the window 24 is movable so as to change the opening area of the window 24. When movable portions 36 are actuated to decrease the opening area of the window 24, only a portion near a distal end of the wire 80 is surrounded by the portions 36. When the reducing gas is supplied to the convey path 10 through the gas path 31 in the heater block 30, the reducing gas flows as indicated by arrow 4 through the window 24 having a small opening area, and the space surrounding the lower end of the wire 80 is set in a reducing gas atmosphere.

The operation of the apparatus having the above-described structure will now be described. As shown in FIG. 1, the lead frame 40 is conveyed on the guide rail (not shown) along the direction indicated by arrow 2, and stopped at the portion 12. The lead frame 40 is heated by the heater block 28 to about 400° C. When the collet 52 is moved downward, the semiconductor pellet 50 clamped by the collet 52 is guided into the convey path 10 through the window 22. Solder is applied by an appropriate means to a lower surface of the pellet 50. The pellet 50 is then mounted on the mount portion of the lead frame 40 through a solder layer 54. Thereafter, the lead frame 40 is moved along the direction indicated by arrow 2, and stopped at the portion 14 as shown in FIG. 2. The lead frame 40 is heated by the heater block 30 to about 300° C. The pellet 50 on the lead frame 40 has an electrode pad 56 formed thereon. The pad 56 is also heated by the heater block 30 to about 300° C. The capillary 60 is moved downward together with the wire 80 to an inlet port of the convey path 10 in the vicinity of the window 24. A gas mixture of $H_2$ and $O_2$ gases is sprayed from the tube 92 of the burner 90 to form the torch 100. A gas mixture of $O_2$ and $N_2$ gases is sprayed from a space 96 between the tubes 94 and 92 to form the curtain 102 around the torch 100. A reducing gas obtained by mixing $H_2$ and $N_2$ gases is supplied to the convey path 10 through the gas path 31 in the heater block 30. The reducing gas is heated to 200° C. or higher by the heater block 30. The movable portions 36 are moved to decrease the opening area of the window 24. The reducing gas flows in the convey path 10 along a direction indicated by arrow 4 to surround the lower end portion of the wire 80 and the torch 100. In this manner, in a high-temperature reducing gas atmosphere, the lower end portion of the wire is heated and melted by the torch 100 to form the ball 82. Therefore, the copper is not subjected to oxidation, thus preventing a bonding failure.

The mixing ratio of $H_2$ gas to $N_2$ gas of the reducing gas is preferably selected to be 5 to 20% and 95 to 80% by volume, i.e., 1:19 to 1:4. In order to increase the reducing power, the amount of the $H_2$ gas may be increased. However, when the amount of the $H_2$ gas is increased to 20% or higher, an explosion may result. When the amount of the $H_2$ gas is decreased below 5%, the reducing power is decreased. Therefore, the mixing ratio is preferably set in the range described above. In order to further increase the reducing power, a gas discharge port 48 can be provided in the vicinity of the portions 14, 16 and 18 of the heater blocks 30, 32 and 34, respectively, and the reducing gas can be supplied to the convey path 10 through each port 48.

A gas mixture obtained by mixing the $H_2$ and $O_2$ gases in the volume ratio of 2:1 is preferably sprayed from the tube 92 to form the torch 100. Meanwhile, a gas mixture of the $O_2$ and $N_2$ gases is sprayed from the space between the tubes 94 and 92 to form the curtain 102. The air curtain 102 is formed to prevent the torch 100 from being extinguished due to the reducing atmosphere of the portion 14. Preferably, the mixing ratio of $O_2$ to $N_2$ to the gas mixture forming the curtain 102 is a ratio sufficient to keep a reducing gas atmosphere and torch 100 in a stable state. If the amount of the $O_2$ gas is excessive, the portion 14 (around the lower end portion of the wire 80) cannot be kept in a reducing gas atmosphere.

Figure 9A:
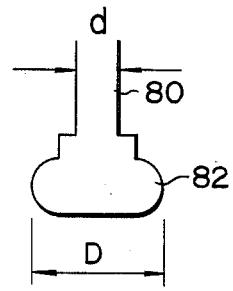
FIG. 9A shows a bonding region of a bonding wire.
Figure 9B:
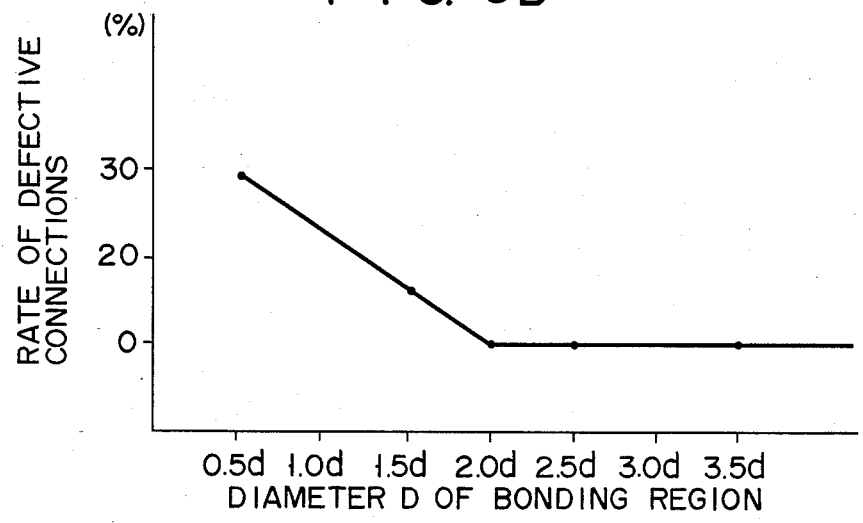
FIG. 9B is a graph showing a relationship between the diameter of a bonding region and the rate of occurrence of defective semiconductor devices.

After the ball 82 is formed, the capillary 60 is lowered as shown in FIG. 3 to urge the ball 82 against the pad 56, thereby thermocompressing the wire 80. In this case, the diameter of the bonding region of the electrode pad 56 and the ball 82 is set to be twice or more that of the cross section of the wire 80. FIG. 9B is a graph of the occurrence rate of defective connections when the final product is subjected to a temperature cycling test. In FIG. 9B, the diameter D of the bonding region shown in FIG. 9A is plotted along the abscissa and the occurrence rate of defective connections is plotted along the ordinate axis. Reference symbol d denotes the cross section diameter of the wire 80. As is apparent from FIGS. 9A and 9B, when the diameter of the bonding region becomes 2.0 d or more, the occurrence rate of defective devices becomes substantially zero. For these reasons, the diameter of the bonding region must be set to 2 times or more that of the wire 80.

Figure 10A:
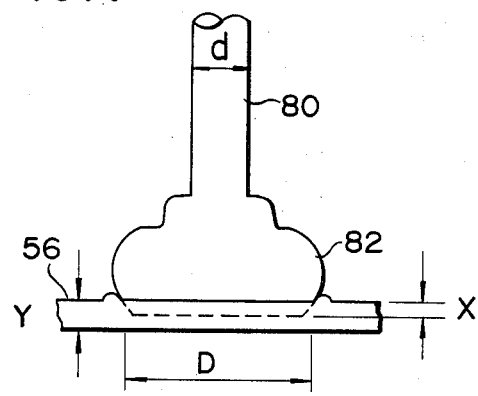
FIGS. 10A and 10B explain the depth of a bonding wire extending into an electrode pad.
Figure 10B:
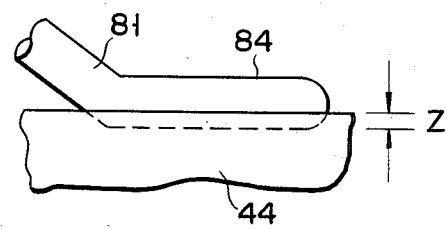
Figure 10C:
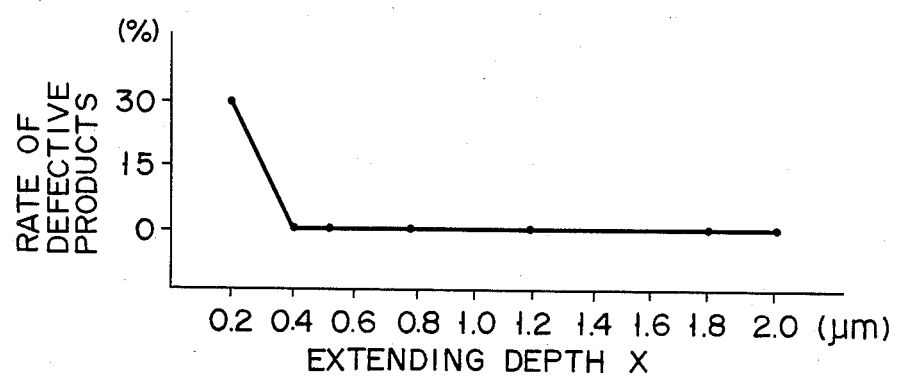
FIG. 10C is a graph showing a relationship between the length of a bonding wire extending into the electrode pad and the rate of occurrence of defective semiconductor devices.

In wire bonding, the flat end portion of the ball 82 preferably extends into the pad 56 to a depth of 0.4 to 3 $\mu$m. Referring to FIG. 10A, reference symbol X denotes a depth to which the ball 82 extends into the pad 56 having thickness Y. FIG. 10C is a graph showing a relationship between the extending depth X of the ball 82 and the occurrence rate of defective products when the final products are subjected to the temperature cycling test. As apparent from FIG. 10C, when the depth X is 0.4 $\mu$m or more, the occurrence rate of defective products becomes substantially zero. For this reason, the flat end portion of the ball 82 is set to extend into the pad 56 to a depth of 0.4 $\mu$m or more. When the pad 56 comprises an aluminum layer having a thickness of 1 to 3 $\mu$m and the wire 80 comprises a copper wire having a diameter of 25 $\mu$m, a load of 50 to 100 g can be applied to the wire 80 so that depth X becomes 0.5 to 2.5 $\mu$m.

Figure 11:
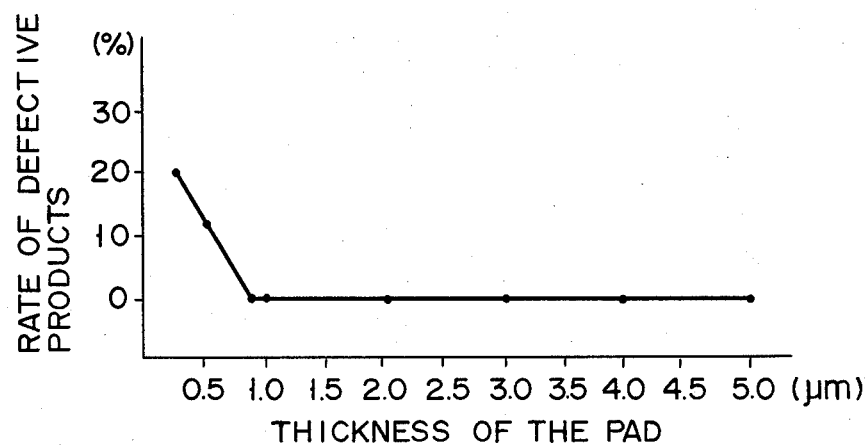
FIG. 11 is a graph showing a relationship between the thickness of an electrode pad and the rate of occurrence of defective semiconductor devices.

The bonding wire made of copper or a copper alloy has a hardness about twice that of a gold wire. Therefore, if the pad 56 is thin, cracking tends to occur in the surface of the pad 56. FIG. 11 is a graph showing a relationship between the thickness of the pad and the occurrence rate of defective products. In FIG. 11, the thickness of the pad 56 is plotted along the abscissa and the occurrence rate of defective products is plotted along the ordinate axis. As apparent from FIG. 11, when the thickness of the pad 56 is set to be 1 $\mu$m or more, the occurrence rate of defective products can be decreased to substantially zero.

Subsequently, the wire 80 is fused by the oxyhydrogen torch of the burner 90 at a predetermined length as shown in FIG. 3. In this case, balls 82 and 84 are formed at distal ends of a wire 81 connected to the pad 56 and the wire 80 left in the capillary 60, respectively. The wires 80 and 81 are surrounded by the reducing gas during this fusing.

The wire 81 is bent by an appropriate means (not shown) to a side of the outer lead 44 of the lead frame 40 as shown in FIG. 4. The lead frame 40 is then moved from the portion 14 to the portion 16. In this case, the temperature of the reducing gas in the convey path 10 is kept at 200° to 300° C., thereby keeping the wire 81 in the reducing atmosphere.

Figure 5:
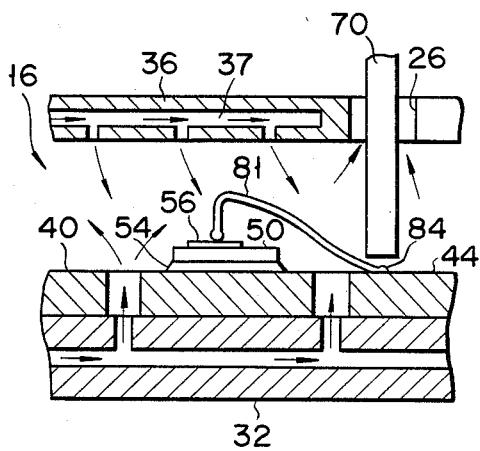

The lead frame is then stopped at the portion 16 as shown in FIG. 5. The heater block 32 heats the lead frame 40 to about 300° C. or higher. The compressing member 70 is moved downward and inserted in the convey path 10 through the window 26. The member 70 thermocompresses the ball 84 of the wire 81 against the outer lead 44 made of copper or copper alloy. When the diameter of the wire 81 is 25 $\mu$m, a load of 300 to 500 g is preferably applied thereto so that the ball 84 extends into the outer lead 44 to a depth of 20 to 50 $\mu$m (indicated by Z in FIG. 10B) as shown in FIG. 10B. By thermocompressing the ball 84 of the wire 81 to the outer lead to the depth as described, the occurrence rate of defective products can be reduced to substantially zero. The wire 81, the ball 84 and the member 70 are surrounded by the reducing gas during this postbonding.

Figure 6:
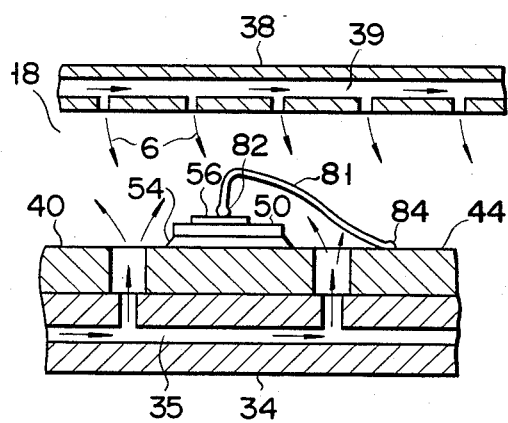

Thereafter, as shown in FIG. 6, the lead frame 40 is conveyed to the portion 18 and heated by the heater block 34 to about 300° C. or higher, thereby being baked. In this case, the reducing gas is supplied to the convey path 10 through the gas path 35 in the heater block 34, and simultaneously the reducing gas is blown into the convey path 10 through the path 39 in the gas introducing member 38. In this manner, the semiconductor pellet 50, the wire 81 and lead frame 40 are also kept in the reducing atmosphere at the portion 18.

Figure 7:
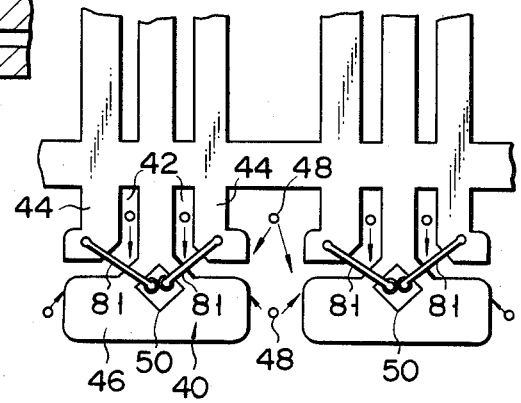
FIG. 7 is a plan view of assembled semiconductor devices.

In this manner, the bonding wire 81 is looped between the pad 56 of the pellet 50 and the outer lead 44 of the lead frame 40 as shown in FIG. 7. Although a single wire is shown in FIGS. 1 to 6, two bonding wires are looped in practice as shown in FIG. 7. According to the present invention, a bonding wire made of copper or a copper alloy is used so that various above-mentioned drawbacks inherent in bonding using a gold wire can be prevented. In addition, the bonding wire can be securely connected, and degradation in electrical characteristics at the connecting portion can be decreased to a minimum. The bonding wire can be fused not only by using the oxyhydrogen torch as in the embodiment described above but also by using a laser or electric torch. The ball can be formed at each of the cut ends of the bonding wire not only by the ball to ball method but also by cutting the bonding wire by a wedge of the capillary.

Figure 12:
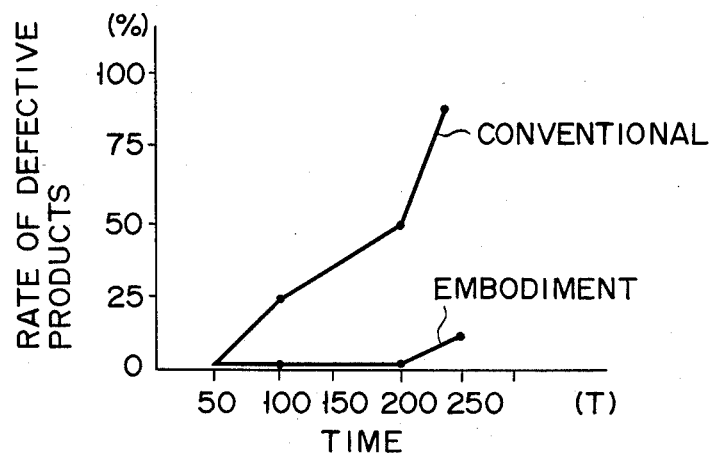
FIG. 12 shows a graph showing results of a high-temperature exposure test.

A high-temperature exposure test was performed for a semiconductor device manufactured in the manner described above. The results of the test are shown in FIG. 12. FIG. 12 is a graph showing the occurrence rate of defective products according to the embodiment of the present invention together with that according to a conventional apparatus. In FIG. 12, the exposure time is plotted along the abscissa and the occurrence rate of defective products is plotted along the ordinate axis. In the conventional method, the bonding wire is made of gold and the diameter of the bonding region of the ball and the electrode pad is ½ that of the cross section of the bonding wire. The other conditions are the same as in the embodiment of the present invention. With the conventional apparatus, 25% of the final products became defective after 100 hours, and substantially 50% became defective after 200 hours. In contrast to this, in the embodiment of the present invention, the occurrence rate of defective products was substantially zero even after 200 hours.

The temperature cycling test was performed for the semiconductor devices manufactured by the apparatus of the embodiment of the present invention and the conventional method. Also, the mechanical strength test was performed for the looped bonding wire of the devices manufactured by both apparatuses. In the temperature cycling test, the semiconductor device according to the preset invention exhibited a performance considerably superior to that of the conventional apparatus as a comparative example. In the mechanical strength (tensile strength) test, the bonding wire made of a copper alloy according to the present invention exhibited a strength 2 to 2.5 times that of the bonding wire made of gold as a comparative example.

What is claimed is:

1. An apparatus for manufacturing a semiconductor device, wherein a bonding wire of copper or copper alloy is looped between an electrode pad of a semiconductor element and and an outer lead of a lead frame, comprising:
    a convey path for conveying the lead frame along a convey direction, said convey path being provided with a wire bonding portion and a postbonding portion which are separated from each other along the convey direction;
    ball forming means for heating the bonding wire at said wire bonding portion and forming balls at both ends of the bonding wire, said ball forming means including a double-structure burner having an inner tube and an outer tube outside said inner tube, wherein a first gas mixture of an $H_2$ gas and an $O_2$ gas in a mixing ratio of 2:1 $H_2$ to $O_2$ is blown from said inner tube to form an oxyhydrogen torch, and a second gas mixture of an $O_2$ gas and an $N_2$ gas is blown from a space between said outer tube and said inner tube to form an air curtain around the oxyhydrogen torch;
    bonding wire feeding means for feeding the bonding wire to said wire bonding portion and compressing the ball of the bonding wire on the electrode pad;
    compressing means for compressing the ball of the bonding wire on the outer lead at said postbonding portion; and
    gas supply means for supplying a reducing gas to said wire bonding portion and said postbonding portion and surrounding the bonding wire and the balls by a reducing gas atmosphere to prevent the balls from being oxidized;
    wherein the mixing ratio of $N_2$ gas to $O_2$ gas in said second gas mixture is selected to maintain said oxyhydrogen torch in a stable state while maintaining said reducing gas atmosphere surrounding the bonding wire and the balls.

2. An apparatus according to claim 1, further comprising heating means, provided at each of said wire bonding portion and said postbonding portion, for heating the lead frame.

3. An apparatus according to claim 2, wherein said heating means heats the lead frame to about 300° C.

4. An apparatus according to claim 1, wherein the reducing gas is kept at a temperature not lower than 200° C.

5. An apparatus according to claim 4, wherein the reducing gas supplied by said gas supply means comprises a gas mixture of an $H_2$ gas and an $N_2$ gas wherein the mixing ratio of $H_2$ gas to $N_2$ gas is 1:19 to 1:14.

6. An apparatus according to claim 1, wherein said bonding wire feeding means urges the ball of the bonding wire against the electrode pad so that a diameter of a bonding region of the ball and the electrode pad becomes not less than twice that of the bonding wire.

7. An apparatus according to claim 6, wherein said bonding wire feeding means urges the ball of the bonding wire against the electrode pad so that a part of the ball extends into the electrode pad to a depth of 0.4 to 3 $\mu$m.

8. An apparatus according to claim 7, wherein said bonding wire feeding means applies a load of 50 to 100 g to the bonding wire.

9. An apparatus according to claim 1, wherein said compressing means urges the ball of the bonding wire against the outer lead so that a part of the ball extends into the outer lead to a depth of 20 to 50 $\mu$m.

10. An apparatus according to claim 9, wherein said compressing means applies a load of 300 to 500 g to the bonding wire.

11. An apparatus according to claim 1, wherein said convey path comprises a die bonding portion before said wire bonding portion along the convey direction.

12. An apparatus according to claim 11, further comprising semiconductor element mounting means for supplying a semiconductor element to said die bonding portion and mounting the element on the lead frame.

13. An apparatus according to claim 1, wherein said convey path comprises a cover, and a portion of said cover corresponding to said wire bonding portion includes a window for supplying the bonding wire to said convey path therethrough.

14. An apparatus according to claim 13, wherein said window has a variable opening area, and the opening area of said window may be decreased such that the ball is surrounded by the reducing gas when said burner melts the bonding wire to form the ball.

15. An apparatus for manufacturing a semiconductor device, wherein a bonding wire of copper or copper alloy is looped between an electrode pad of a semiconductor element and an outer lead of a lead frame, comprising:
    a convey path for conveying the lead frame along a convey direction, said convey path being provided with a wire bonding portion and a postbonding portion which are separated from each other along the convey direction, said convey path comprising a cover, a portion of said cover corresponding to said wire bonding portion including a window for supplying the bonding wire to said convey path therethrough;
    ball forming means for heating the bonding wire at said wire bonding portion and forming balls at both ends of the bonding wire, said ball forming means including a double-structure burner having an inner tube and an outer tube outside said inner tube, wherein a first gas mixture of an $H_2$ gas and an $O_2$ gas in a mixing ratio of 2:1 $H_2$ to $O_2$ is blown from said inner tube to form an oxyhydrogen torch, and a second gas mixture of an $O_2$ gas and an $N_2$ gas is blown from a space between said outer tube and said inner tube to form an air curtain around the oxyhydrogen torch;

bonding wire feeding means for feeding the bonding wire to said wire bonding portion and compressing the ball of the bonding wire on the electrode pad;

compressing means for compressing the ball of the bonding wire on the outer lead at said postbonding portion; and gas supply means for supplying a reducing gas to said wire bonding portion and said postbonding portion and surrounding the bonding wire and the balls by a reducing atmosphere to prevent the balls from being oxidized.

16. An apparatus according to claim 15, wherein said window has a variable opening area.

17. An apparatus for manufacturing a semiconductor device, wherein a bonding wire formed of copper or a copper alloy is bonded onto an electrode pad of a semiconductor element, comprising:

a convey path for conveying the semiconductor along a convey direction, said convey path being provided with a wire bonding portion;

ball forming means for heating the bonding wire at said wire bonding portion and forming a ball at one end of the bonding wire, said ball forming means including a double-structure burner having an inner tube and an outer tube outside said inner tube, wherein a first gas mixture of an $H_2$ gas and an $O_2$ gas in a mixing ratio of 2:1 $H_2$ to $O_2$ is blown from said inner tube to form an oxyhydrogen torch, and a second gas mixture of an $O_2$ gas and an $N_2$ gas is blown from a space between said outer tube and said inner tube to form an air curtain around the oxyhydrogen torch;

bonding wire feeding means for feeding the bonding wire to said wire bonding portion and compressing the ball of the bonding wire on the electrode pad; and gas supply means for supplying a reducing or inert gas to said wire bonding portion and surrounding the bonding wire and the ball by the reducing gas to prevent the ball from being oxidized.

18. A bonding method comprising the steps of:

preparing a bonding wire made of copper or a copper alloy;

conveying a lead frame in a convey direction along a convey path, the convey path being provided with a wire bonding portion and postbonding portion which are separated from each other along the convey direction;

heating one end of the bonding wire to form a ball at the end of the bonding wire by using a double-structure burner having an inner tube and outer tube outside the inner tube, said heating step including a blowing a first gas mixture of an $H_2$ gas and an $O_2$ gas in a mixing ratio of 2:1 $O_2$ to $N_2$ from the inner tube to form an oxyhydrogen torch and blowing a second gas mixture of $O_2$ gas and $N_2$ gas from a space between the outer tube and the inner tube to form an air curtain around the oxyhydrogen torch;

feeding the bonding wire so that the ball of the bonding wire contacts the electrode pad;

compressing the ball of the bonding wire onto the electrode pad; and supplying a reducing or inert gas to the ball of the bonding wire at the wire bonding and post bonding portions to surround the bonding wire by the reducing gas, thereby preventing the ball from being oxidized.

19. The bonding method according to claim 18, wherein the reducing gas flows along the bonding wire toward the electrode path.

* * * * *